United States Patent [19]

Pinney

[11] Patent Number: 5,066,161
[45] Date of Patent: Nov. 19, 1991

[54] FRAMEWORK FOR CABINET STRUCTURE

[76] Inventor: Richard C. Pinney, 2110 Deodar St., Santa Ana, Calif. 92701

[21] Appl. No.: 543,210

[22] Filed: Jun. 25, 1990

Related U.S. Application Data

[63] Continuation-in-part of Ser. No. 348,562, May 8, 1989, Pat. No. 4,954,007.

[51] Int. Cl.$^5$ .................................. F16D 1/00
[52] U.S. Cl. .................................. 403/172; 403/219; 403/217
[58] Field of Search ............... 403/219, 217, 295, 172, 403/176

[56] References Cited

U.S. PATENT DOCUMENTS

| | | |
|---|---|---|
| 2,167,525 | 7/1935 | Rosendale . |
| 3,050,194 | 8/1962 | Sinninger . |
| 3,087,768 | 4/1963 | Anderson et al. . |
| 3,182,846 | 5/1965 | La Kaff . |
| 3,265,419 | 8/1966 | Durnbaugh et al. . |
| 3,919,603 | 11/1975 | Salvati et al. . |
| 4,154,493 | 5/1979 | Prater . |
| 4,782,637 | 11/1988 | Eriksson et al. . |

FOREIGN PATENT DOCUMENTS

1261219 1/1972 United Kingdom .
2072494 10/1981 United Kingdom .

*Primary Examiner*—Andrew V. Kundrat
*Attorney, Agent, or Firm*—Newport Law Offices

[57] ABSTRACT

A frame structure for an electronic or electrical cabinet is disclosed including structural members which comprise a substantially closed square shaped tube wherein two walls of the tube substantially adjacently meet but turn outwardly into two flanges. The structural members may be attached together to form corner structures for a frame by either welding or modular means. In a modular arrangement, a block-shaped corner member having block-shaped protrusions is used to hold three structural members in a rigid corner arrangement. In a welded arrangement, three structural members are intersectingly connected with the flanges formed to mutually abut such that welding the flanges of one structural member to one of the flanges of each of the other structural members is all that is necessary to hold the three structural members in a rigid corner arrangement.

16 Claims, 6 Drawing Sheets

FRAMEWORK FOR CABINET STRUCTURE

This is a Continuation in Part of U.S. application Ser. No. 07/348,562, filed May 8, 1989 now U.S. Pat. No. 4,954,007.

BACKGROUND OF THE INVENTION

1. Field of the Invention

The invention relates generally to cabinets and, more particularly, to a simple cabinet frame structure for housing electrical and electronic equipment and the like.

2. Description of Related Art

Many cabinet configurations for containing and protecting electrical assemblies have been developed in the last half century to house everything from complex vacuum tubes and other easily damaged components of the past to state of the art compact high speed hybrid circuits. Today electronic and electrical assemblies differ as to the space and proportions necessary to house them. While a cabinet the size of several refrigerators may be necessary to house a complex high voltage switching system, a cabinet the size of a phone book may be needed to house a more compact electrical arrangement. Although many cabinet structures have evolved, a basic cabinet frame structure that provides strength, ease of assembly, interchangeable simple parts in both a large or small structure, has yet to be realized.

A number of attempts have been made to provide a cabinet which satisfies these criteria, but typically either the cost or the complexity or both, and the size, versatility or strength has been less than desirable. By way of example, the following U.S. patents disclose either welded or modular frame assemblies representative of cabinet structures developed over the last 50 years:
U.S. Pat. No. 2,167,525: Rosendale
U.S. Pat. No. 3,265,419: Durnbaugh et al.
U.S. Pat. No. 3,182,846: La Kaff
U.S. Pat. No. 3,919,603: Salvati et al.

The patents to Rosendale and Durnbaugh et al. both disclose welded cabinet structures. Rosendale employs gussets, triangular pieces of metal, welded in each corner to hold three mutually perpendicular struts in a corner arrangement. Durnbaugh et al. eliminates such gusset members and welds his strut members directly intersectingly together. However, each of their three strut members which form each corner have different end cross-sectional configurations and end profiles which complicates manufacture and construction of their frame. Additionally, four welds are desired to join the struts to create a rigid frame structure. The cabinet structures of Rosendale and Durnbaugh et al. therefore are very labor intensive.

The patents to La Kaff, and Salvati disclose cabinet configurations that involve mechanical assembly. In La Kaff, side frame struts are coupled to top and base members using engaging elements formed of generally rectangular aluminum blocks, which are attached by welding to the top and bottom members and struts. The engaging elements have frustoconical portions configured to fit snugly together. The top and base members are mated via the engaging elements, and bolted together. Both manufacturing costs and lack of versatility make this frame an undesirable alternative. Salvati et al. disclose a switch board frame assembly including a corner tie for supporting three structural corner members together. The corner tie has three perpendicular legs rectangularly shaped with three sides and outwardly facing flanges, the three struts being slid over the leg portions. However, the struts and leg portions have different cross-sectional configurations, and the corner tie is of a generally complex configuration, such that this frame structure is not conducive to low cost manufacturing techniques.

It would be an advancement in the art to provide a simple cabinet that eliminates the aforementioned disadvantages of the prior art.

SUMMARY OF INVENTION

It is therefore an object of the present invention to provide a cabinet frame structure in which manufacture and construction is simplified.

It is another object of this invention to provide a cabinet frame structure that has good strength but is relatively light in weight.

It is still another object of the present invention to provide a cabinet frame structure that can be built from a few basic standardized elements, by lay persons without special skill or special tools.

A cabinet frame structure according to the present invention includes structural frame members or elongated struts which comprise elongated tubular members having adjacent out-turning flanges or margins which extend along the member. The structural frame members may be affixed together to form corner arrangements for a frame structure in either modular or welded combinations.

In a modular combination, a frame structure includes corner members having substantially block-shaped portions with engaging protrusions extending outwardly therefrom at predetermined angles, dependent on the geometrical configuration of the corner desired. The structural frame members are slidably inserted over the engaging protrusions, and these parts are secured together by a fastening means.

In a welded combination, the structural frame members are welded together in a unique but rigid corner construction. Three intersecting structural frame members are formed for mutual abutment in a trihedral corner arrangement by tailoring the flanges to be abuttingly located. More specifically, the flanges of the three members are formed so that at least one of the flanges of any one of the structural members abuts at least one of the flanges of one of the other two structural members. The entire corner arrangement may be held rigidly together by welding abutting flanges together. A cabinet frame can be constructed with a minimum of internal welds. Moreover, welds may be made, such as external welds, joining the elongated tubular members.

Other and further objects, advantages and characteristics features of the present invention will become readily apparent from the following detailed descriptions of preferred embodiments of the invention when taken in conjunction with the accompanying drawings.

DETAILED DESCRIPTION OF PREFERRED EMBODIMENTS

Figure 1:
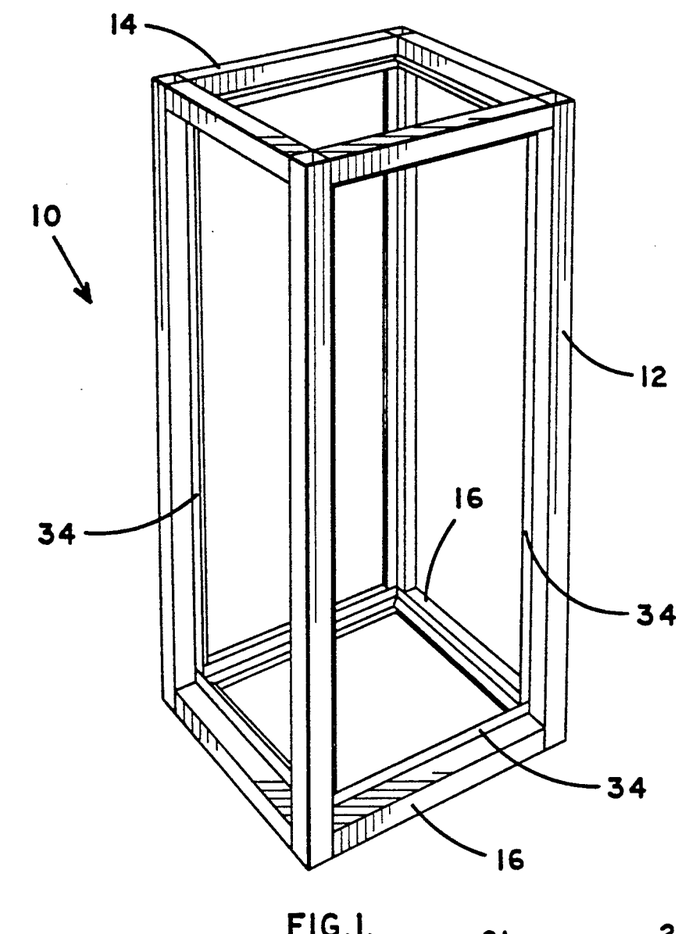
FIG. 1 is a perspective view of a basic cabinet frame structure built in accordance with the principles of the invention.

Referring now with more particularity to the drawings, wherein like or similar parts are designated by the same or primed numerals throughout the various figures, a basic frame structure 10 built in accordance with the principles of the invention is shown in FIG. 1. The basic frame structure 10 may be rectangularly shaped as shown having four elongated vertical structural members 12, four elongated horizontal top structural members 14 and four elongated horizontal base structural members 16, all secured together in a generally perpendicular relationship at eight corner points. The intersecting corners are secured together by simple and economical construction means described below.

Figure 1A:
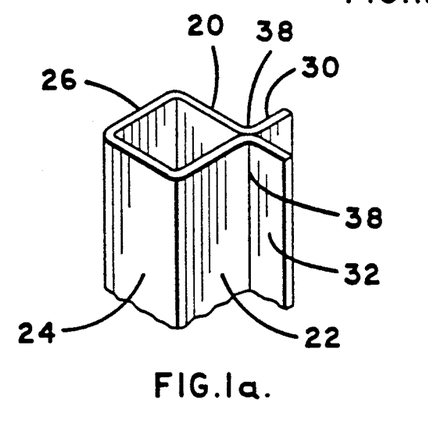
FIG. 1a is a partial view of a typical structural member of the frame structure of FIG. 1.

As shown in FIG. 1a each of the elongated structural members 12, 14 and 16 may comprise a generally square substantially closed tube having four walls 20, 22, 24 and 26. Two adjacent walls 20 and 22 substantially meet or abut at one corner 38 of the tube but turn outwardly forming flanges 30, 32 at about right angles to each other. Flanges 30 and 32 are preferably essentially coplanar with walls 22 and 20, respectively, forming right angle flanges. These flanges 30, 32 extend along the length of the tube and provide recessed surfaces 34 to which formed sheet metal coverings or the like (not shown) can be mounted to form outer surfaces for a cabinet. The structural members 12, 14 and 16 may be fabricated by roll forming and may be made of 11 gauge cold rolled steel, for example. The two flanges may be tack welded together or continuous bead welded along the extent of the abutting out-turning corners 38 of the tube, for example, to provide additional strength to the structural members if desired.

Figure 1B:
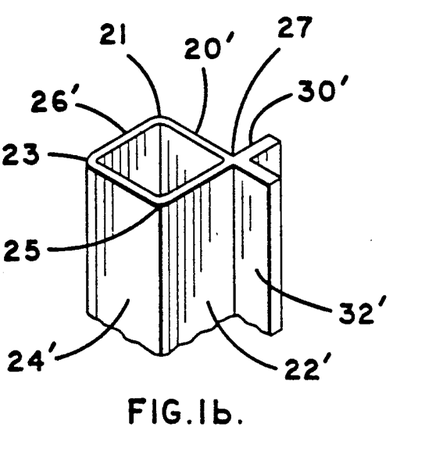
FIG. 1b is a partial view of another embodiment of a typical structural member for the frame structure of FIG. 1.

Alternatively, as shown in FIG. 1b, each elongated structural member 12, 14 and 16 may comprise a square shaped tubular beam having four walls 20', 22', 24' and 26' and four corners 21, 23, 25 and 27 with two flanges 30' and 32', along one of the corners. Flanges 30' and 32' preferably are essentially coplanar with walls 22' and 20', forming right angle flanges. The unibody structural member shown in FIG. 1b may be fabricated by extruding aluminum, the flanges of the extruded structure being thicker than the walls thereof, for example.

Figure 1C:
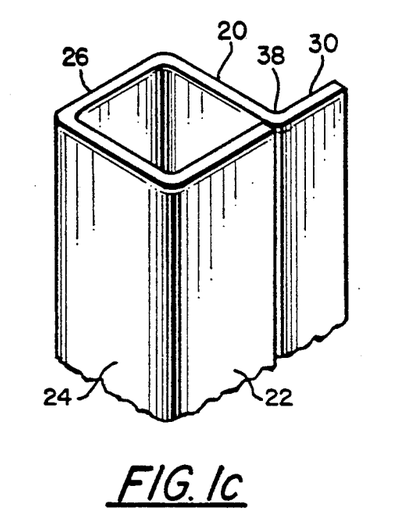
FIG. 1c is a partial view of another embodiment of a typical structural member that may be used in the frame structure of FIG. 1.
Figure 1D:
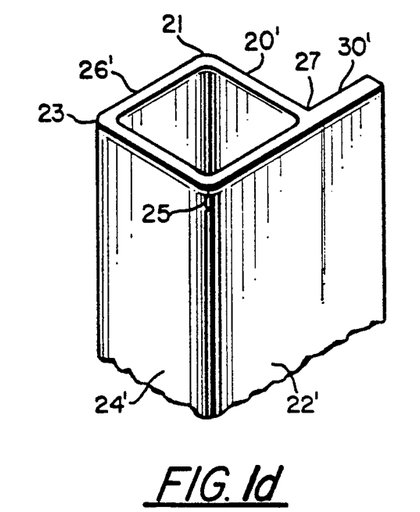
FIG. 1d is a partial view of yet another embodiment of a typical structural member.

In yet a further embodiment, as shown in FIG. 1c, each elongated structural member 12, 14 and 16 may comprise a generally square substantially closed tube having four walls 20, 22, 24 and 26. Two adjacent walls 20 and 22 substantially meet or abut at one corner 38 of the tube, one wall 20 turning outwardly therefrom forming flange 30. Flange 30 is preferably coplanar with wall 22, forming a single right angle flange. The two walls 20 and 22 may be tack welded together or continuous bead welded along the extent where they substantially meet or abut namely corner 38, for example, to provide additional strength to the structural member, if desired. The single flange embodiment may be roll formed, for example. Alternatively, the single flange embodiment may take the form of a unibody single flange structural member as shown in FIG. 1d, which may be fabricated by aluminum extrusion, for example. The unibody embodiment comprises a square shaped tubular beam having four walls 20', 22', 24' and 26' and four corners 21, 23, 25 and 27 with one flange 30' along one of the corners 27. Flange 30' is preferably coplanar with wall 22', forming a single right angle flange with the tubular beam.

Figure 2:
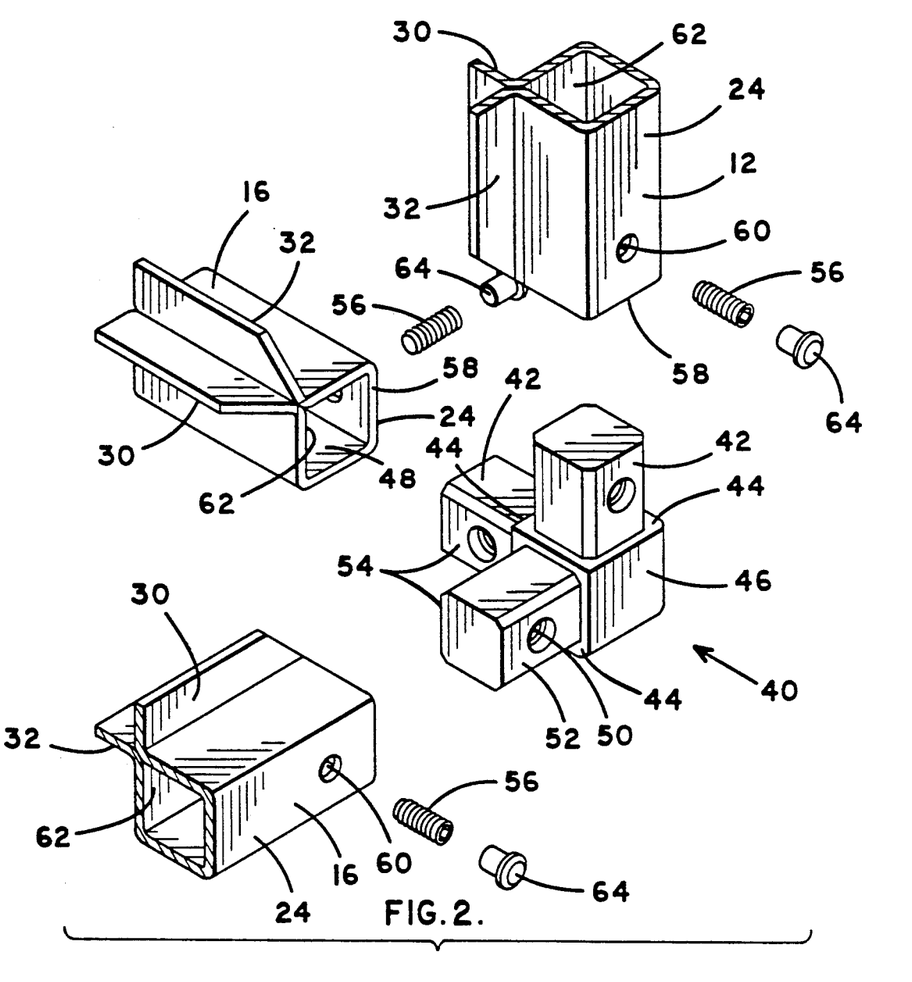
FIG. 2 is a perspective, exploded view of a modular frame corner arrangement according to the invention.
Figure 3:
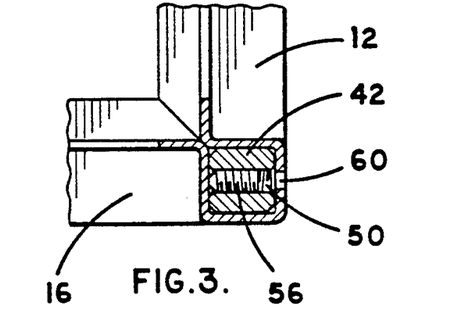
FIG. 3 is a side view, partially broken away, after assembly of the frame corner arrangement shown in FIG. 3.

A modular embodiment for securing the above-described structural members together in rigid corner arrangements is shown in FIGS. 2 and 3. Corner member 40 is used to hold the structural members together, such as two of the base members 16 and a vertical member 12, for example, as is shown in FIG. 2. Corner member 40 is a one piece monolithic element that has three mutually perpendicular rectangularly shaped block-shaped protrusions 42 extending outwardly from three mutually perpendicular faces 44 of a block-shaped portion 46. The rectangularly block-shaped protrusions 42 of corner member 40 are of the same general cross-sectional configuration or shape as the cross-sectional opening 48 of the structural members but of a slightly smaller size, so as to be slidably insertable into the end portion of the structural members.

Threaded holes 50 are formed across the lateral extent of block-shaped protrusions 42, typically from an outer surface 52 to an inner surface 54, thereof. Fastening means such as three locking set screws 56 are inserted into the threaded holes 50. The structural members are slid over the block-shaped protrusions 42, the ends 58 of the tube portions of the structural members resting or abutting against faces 44 of the block-shaped portion 46 of corner member 40. The flanges at the end portions of the three structural members are preferably formed so that corresponding intersecting flanges 30 and 32 mutually abut. Accordingly, flanges 30 and 32 may have there intersecting ends cut at about a 45° angle from the end of the tube 58. Holes 60 are formed in one of the outer walls 24 (or perhaps 26) of the structural members 12 and 16 in predetermined locations such that these holes are aligned with the threaded holes 50 to provide access to the set screws 56 therein when the structural members 12 and 16 and corner members 40 are assembled. Holes 60 may be smaller than the threaded holes 50 but large enough to access set screws by a wrench such as an allen wrench, for example, should the set screws be of the hex socket type. The structural members 12 and 16 for example are securely fastened together with the corner member 40 by tightening set screws 56 against inner walls 62 of the structural members, as shown in FIG. 3. To provide a smooth corner appearance, removable plugs 64 (shown in FIG. 2) may be pressed into the threaded holes 50 after the set screws 56, for example.

Figure 3A:
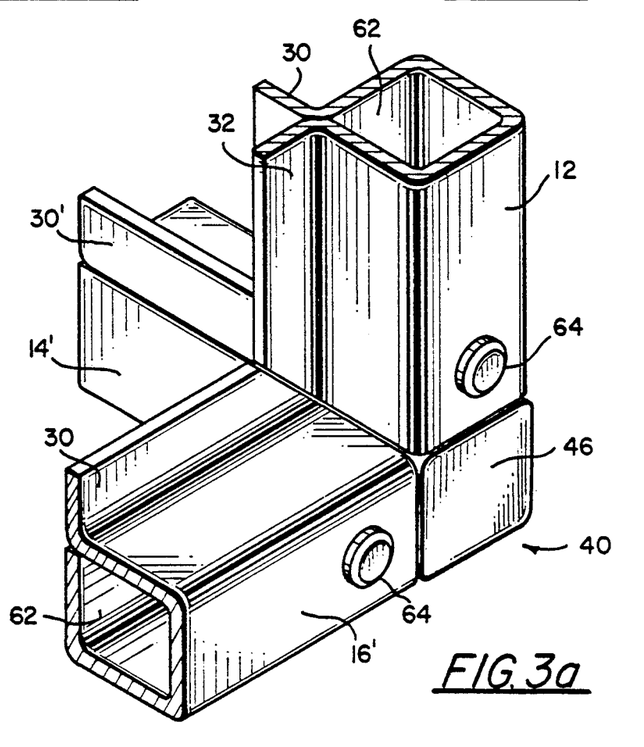
FIG. 3a is a perspective view of another embodiment of a modular frame corner arrangement.

All corners for a cabinet frame structure can be constructed similarly. However, corner arrangements in some cases may have only two perpendicular protrusions, while in other cases four mutually perpendicular protrusions may be necessary. Additionally, while structural members 12, 14, 16 have been illustrated comprising substantially closed tubes with two outwardly flanges as illustrated in FIG. 1a, unibody structural members as illustrated in FIG. 1b may be employed. Additionally, one or more of each of the structural members comprising a modular corner arrangement may have a single flange, such as the structural members illustrated in FIGS. 1c or d. An example of such a corner arrangement is shown in FIG. 3a wherein structural member 12 has two right angle flanges and the two other structural members 14' and 16' have single right angle flanges 30. The flanges at the end portions of these structural members preferably are formed such that corresponding intersecting flanges mutually abut, which adds rigidity to the corner structure. For example, in FIG. 3a flanges 30 of structure member 14' and 16' and flanges 30 and 32 of structural members 12 may be cut from the end of structural members at about a 45° angle, the cut flange ends 30 of structure members 14' and 16' being adjacently abutted with the cut flange ends 30 and 32 of structural member 12. An entire cabinet frame structure therefore can be fabricated using simple and easily manufactured parts and assembled using ordinary hand tools by lay persons without any special training. Additionally, the frame structure can be shipped assembled or unassembled in a kit form.

Figure 4:
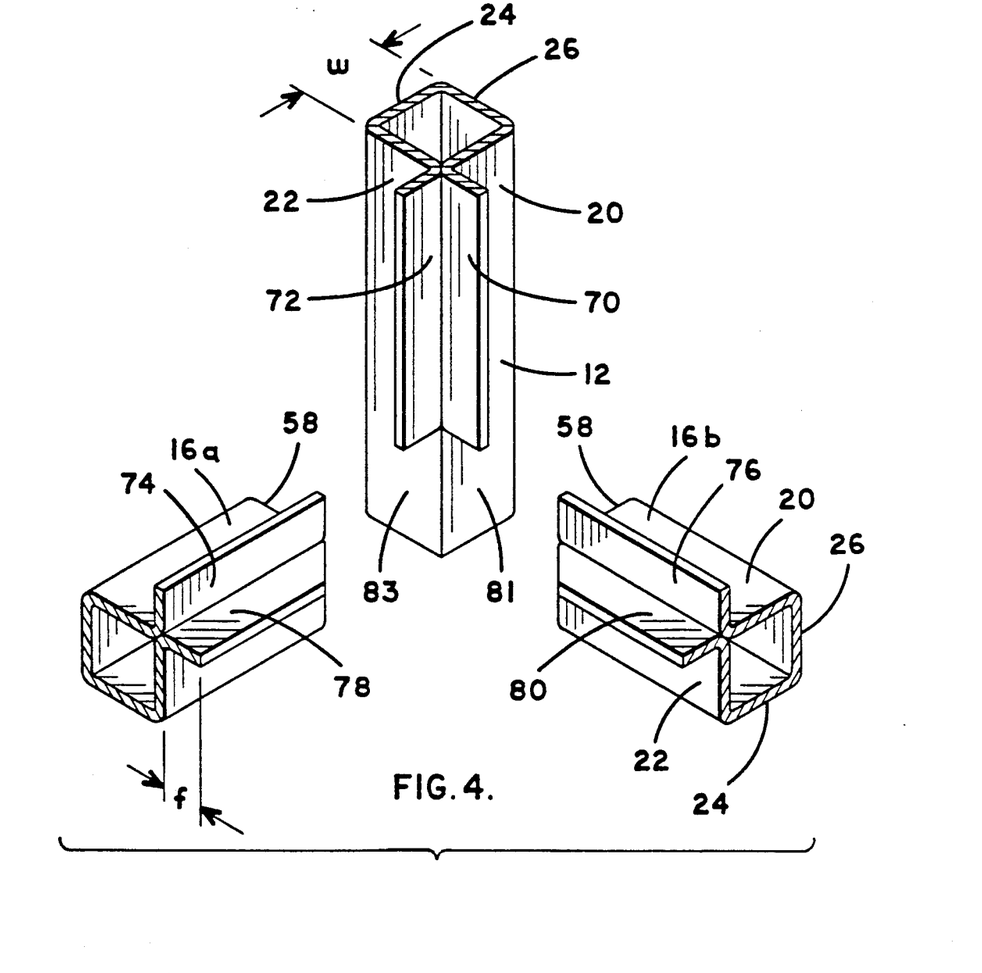
FIG. 4 is a perspective, exploded view of a frame corner arrangement of a welded embodiment of the invention.
Figure 5A:
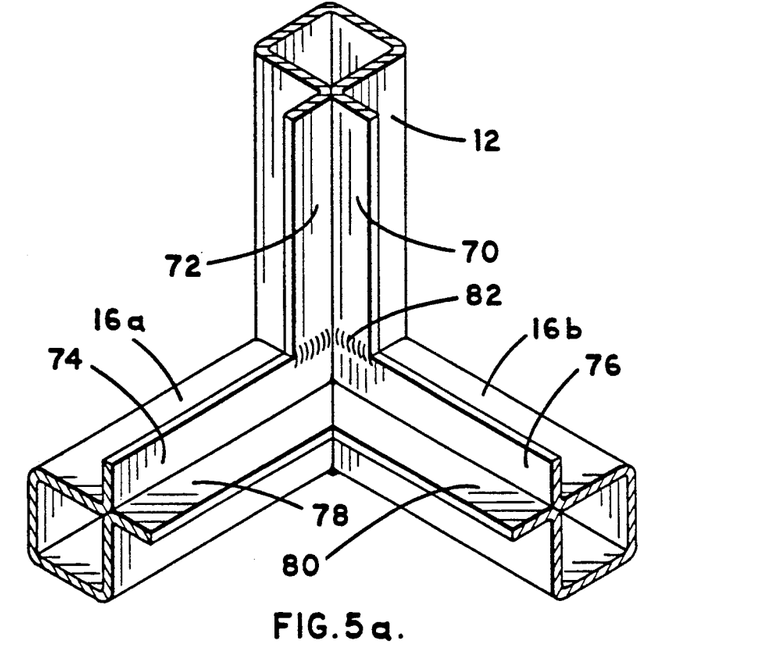
FIG. 5a and b are perspective views of the corner arrangement shown in FIG. 4 in welded assembly.
Figure 5B:
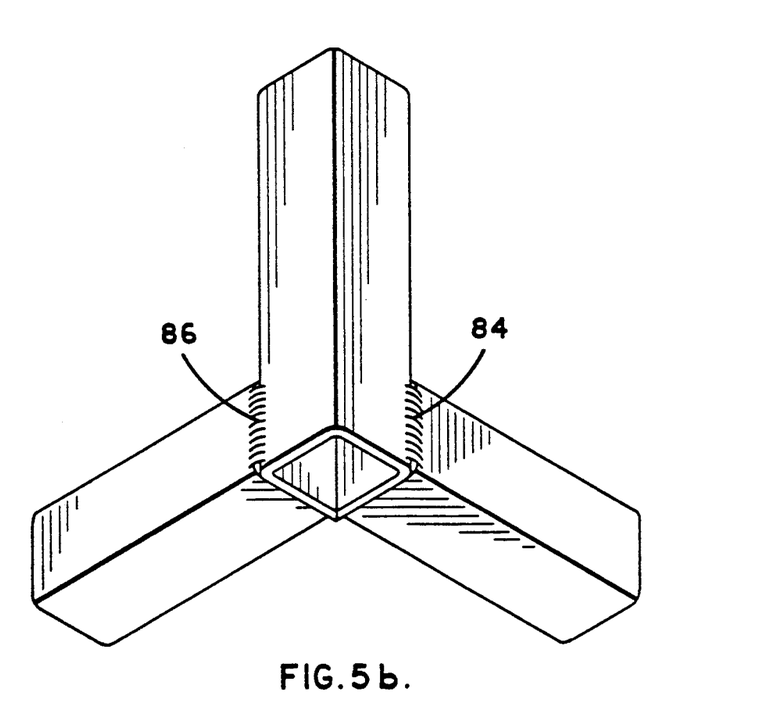

FIG. 4, 5a and 5b illustrates an alternative embodiment of a corner construction for the frame structural members formed to allow mutual connection by welding. Referring more particular to FIG. 4, the structural frame members such as two bottom members 16, designated more particularly as 16a and 16b, and a vertical member 12 are assembled in a substantially mutual perpendicular arrangement to form a corner structure. The walls of the structural members 12, 16a and 16b are substantially the same width designated generally by reference letter "w", as are all the flanges designated generally by reference letter "f".

The flanges 70 and 72 of a first of the structural members 12 are shorter than the longitudinal extent of the walls (20, 22, 24, 26) of the tube portion by an amount approximately equal to the width (f) of flanges of second and third structural members 16a and 16b and the walls widths (w) of walls thereof. As to the second and third structural members 16a and 16b, one of the flanges of each extend to the respective ends 58 thereof (the entire length of the structural member), as full length flanges 74 and 76, and the other of the flanges of these structural members are cut from the ends 58 at about a 45° angle, as cut flanges 78 and 80. The flange geometry of the three structural members provides self fixturing for assembling the members in a very accurate and square corner arrangement without the need for expensive fixturing parts and devices.

FIG. 5a shows the assembly of first, second and third structural members 12, 16a and 16b. Second and third structural members 16a and 16b are intersectingly abutted in a right angle relationship with the cut flanges 78 and 80 in mutual abutment and full flanges 74 and 76 in mutual abutment. First structural member 12 intersects second and third structural members 16a and 16b to form a trihedral arrangement, the end portions 81 and 83 of inside walls 20 and 22 abutting the ends 58 of structural members 16b and 16a, respectively. Additionally, the shorter flanges 70 and 72 of structural member 12 abut respective ones of full flanges 76 and 74 of second and third members 16a and 16b.

To secure the members together, first structural member 12 may be securely attached to second and third structural members 16a and 16b by welding respective ones of flanges 70 and 72 to full flanges 76 and 74 forming weld 82. In a single weld process all three structural members in this corner arrangement (12, 16a and 16b) can be welded securely together. Alternatively, if additional strength is desired, the tube portion of first structural member 12 can be welded to the tube portion of second and third structural members 16a and 16b at the external abutting walls thereof, as welds 84 and 86, as shown in FIG. 5b. External welds 84 and 86 may be ground off to provide a smooth outer surface for the frame structure. However, if no external welds are desired, strength may be added to corner structure by welding either the cut flanges 78 and 80 together, or the full length flanges 74 and 76 together, or perhaps both. Other weld combinations are possible. The above described corner arrangement can be implemented to build an entire frame wherein a squareness of ⅛ of an inch can easily be achieved.

Figures 6A, 6B, 6C:
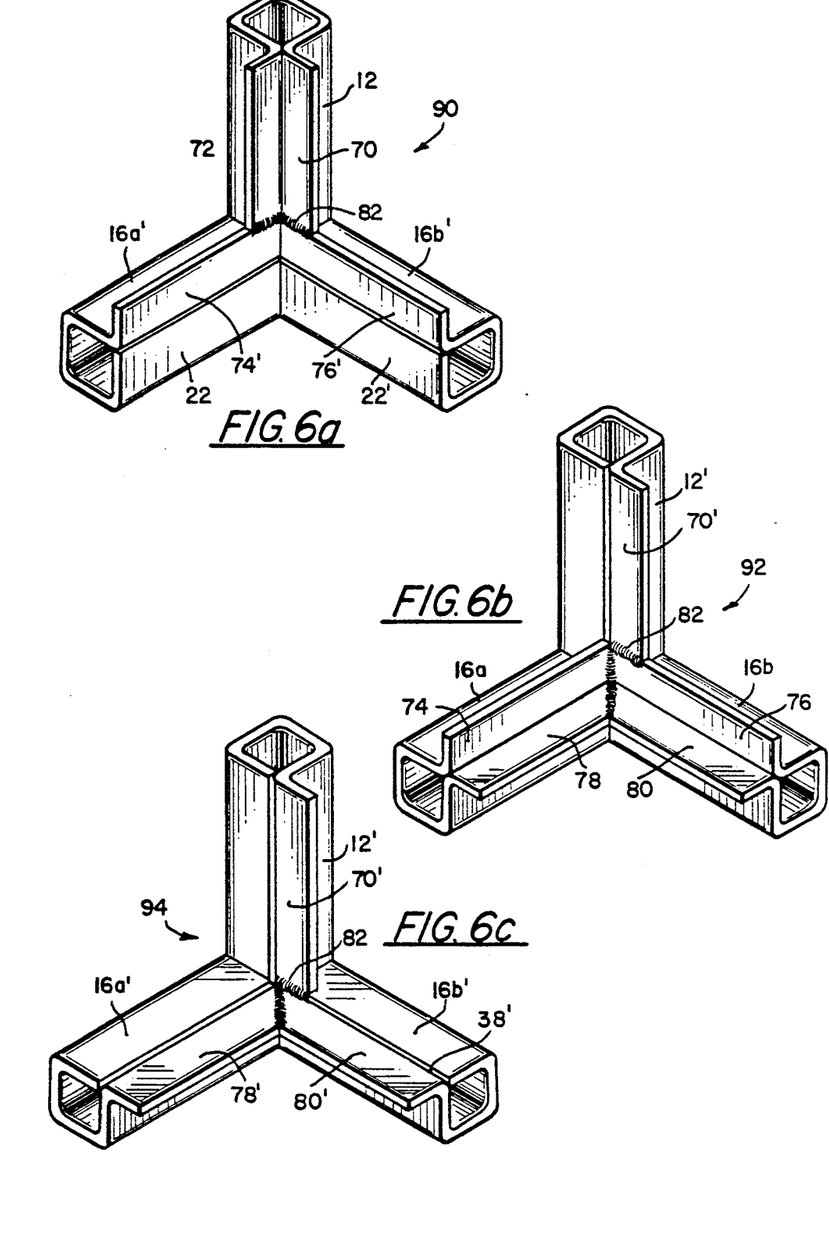
FIG. 6a–c are perspective views of alternative embodiments of welded assemblies.

FIG. 6a, 6b and 6c illustrate other examples of welded corner constructions which may comprise structural members employing various combinations of double flange structural members and single flange structural members, such as those structural members illustrated in FIGS. 1a-1d. For example, the corner structure 90 illustrated in FIG. 6a includes two single flange structural members 16a' and 16b' and a double flange structural member 12 welded together in a trihedral arrangement. The flanges 70 and 72 of the double flange structure member 12 mutually abut with the flanges 76' and 74' respectively of single flange structural member 16a' and 16b', the mutually abutting flanges preferably being welded together. The inside walls 22' of structural members 16a', 16b' are coplanar with the flanges 74' and 76' respectively providing flat surfaces where panel mounts or retma rails may be affixed, for example.

Alternately, the corner structure 92 illustrated in FIG. 6b has two double flange structural members 16a and 16b affixed to a single flange structural member 12' in a trihedral arrangement. The flanges 74, 78 of structural member 16a mutually abuts flanges 76, 80, respectively, of structural member 16b, and flange 70' of structural member 12' mutually abuts flange 76 of structural member 16b. The mutually abutting flanges are preferably welded together forming welds 82.

Another corner arrangement 94 may comprise, for example, three single flange structural members, as illustrated in FIG. 6c. In this corner arrangement, flanges 78' and 80' of structural members 16a' and 16b' mutually abut; while flange 70' of structural member 12' abuts the corner 38' of structural member 16b'. The mutually abutting flanges 78' and 80' may be welded together forming weld 82, and flange 70' welded to the corner 38' of structural member 16b', for example.

In any one of the illustrations of the above-described welded embodiments, the respective mutually abutting tube portions of the structural members in the corner arrangements may be welded together as shown and described for the embodiment illustrated in FIGS. 5a and 5b, for example. Of course many other possible combination corner arrangements are possible utilizing combinations of single and double flange structural members, which are deemed to come within the scope of this description. Additionally, while three structural members have been illustrated in the above-described embodiments, two structural members could be used in combination, four structural members, or more.

While preferred embodiments of corner arrangements have been described with structural members intersecting mutually perpendicularly, corners may be formed at other angles, as needed for the particular cabinet configuration. Additionally, the structural members and the corner elements may be standardized so that only a few standardized parts are required to build a cabinet frame structure. Furthermore, the framework can be loosely assembled, then tighten at a later time. In the preferred embodiments described above, production cost of the frame structures are substantially reduced over prior art structures. Although the construction is simple, the framework provides flanges that will meet standards imposed on the industry for housing electronics.

New and improved frame structures are thus provided. However, various modifications may be made to the above-described preferred embodiments without departing from the scope of the invention. For example, while metallic materials may be used to form the various above described components, structural members and corner members may also be made of other materials such as plastic and perhaps bonded together by gluing rather than welding. Accordingly, it should be understood that although the invention has been described and shown for various particular embodiments, nevertheless various changes and modifications obvious to a person of ordinary skill in the art to which the invention pertains are deemed to lie within the spirit and scope of the invention as set forth in the following claims.

What is claimed is:

1. A corner structure for a frame cabinet structure, comprising:
   a plurality of structural members, each structure member comprising a substantially closed square shaped tubular member having four walls and four corners therebetween, each tube having a substantially right angle flange at one of said corners, two of said four walls substantially adjacently abutting at said corner but with one wall turning outwardly therefore to form said flange substantially coplanar with the terminal end of the other substantially adjacent abutting wall and said two walls being welded together at said one corner where they substantially abut said plurality of structural members being arranged in an intersecting arrangement, said intersecting structural members having flanges formed such that at least one of said flanges of one of said plurality of structural members mutually abuts with at least one of the flanges of another of said structural members, and
   means for securely attaching said plurality of structural members in a rigid corner arrangement.

2. The corner structure defined in claim 1 wherein said securely attaching means comprises welds securely fixing said structural members together.

3. The corner structure defined in claim 1 wherein said securely attaching means comprises a unitary corner member having a block-shaped portion with at least two adjacent surfaces and block-shaped protrusions extending outwardly from said two adjacent surfaces respectively;
   said two protrusions of said corner member slidably inserted into one each of said structural members; and
   means for securely fastening said members and protrusions.

4. The corner structure defined in claim 1 wherein said structural members are unibody structural members.

5. The corner structure defined in claim 4 wherein said securely attaching means comprises welds.

6. The corner structure defined in claim 4 wherein said securely attaching means comprises a unitary corner member having a block-shaped portion with at least two adjacent surface and block-shaped protrusions extending outwardly from said two surfaces respectively;
   said two protrusions of said corner member slidably inserted into one each of said structural members; and
   means for securely fastening said members and protrusions.

7. A frame structure for a cabinet, comprising:
   a plurality of structural members each structural member comprising a substantially closed square shaped tube having four walls, four corners therebetween and two end portions, the four walls forming a hole therethrough, two of said four walls substantially adjacently abutting at one of said four corners but one of said two walls turning and extending outwardly therefrom to form a flange substantially coplanar with the terminal end of the other substantially adjacent abutting wall and said two walls being welded together at said one corner where they substantially abut; and
   means for securely attaching said plurality of structural members in a rigid corner arrangement.

8. The frame structure defined in claim 7 wherein said means for securely attaching said structural members comprises a unitary corner member having a block-shaped portion with three block-shaped protrusions extending outwardly therefrom, three of said plurality of structural members being slid over respective ones of said block-shaped protrusions, and means for securing said corner member to said structural members.

9. The frame structure defined in claim 8 wherein said means for securing said corner member and structural members comprises three threaded elements, said three block-shaped protrusions each having a threaded hole therethrough across their lateral extent, said threaded elements disposed in said threaded holes for securely engaging said structural members to hold said structural members and corner element together.

10. The frame structure defined in claim 7 wherein said means for securely attaching structural members in corner arrangement comprises welding a first, second and third of said plurality of structural members in an intersecting relationship forming a trihedral point as a corner of the frame.

11. The frame structure defined in claim 10 wherein said welding said first, second and third structural members comprises arranging said intersecting structural members such that at least one of said flanges mutually abut with at least one of the flanges of another structural member and a weld joining said mutually abutting flanges, and welds joining the walls of said structural members together.

12. The frame structure defined in claim 11 wherein said mutually abutting flanges are cut at about a 45° angle.

13. The frame structure defined in claim 11 wherein said welds comprise tack welds.

14. A structural member for a cabinet frame structure comprising:

a substantially closed square shaped tubular member having four walls and four corners, two of said walls substantially adjacently abutting at one of said corners one of said walls turning and extending outwardly therefrom to form a flange substantially coplanar with the terminal end of the other substantially adjacent abutting wall and said two walls being welded together at said one corner where they substantially abut.

15. The structural member defined in claim 14 wherein said structural member is roll formed.

16. The structural member defined in claim 14 wherein said flange is a right angle flange.